(12) United States Patent
Valavala et al.

(10) Patent No.: US 11,756,856 B2
(45) Date of Patent: Sep. 12, 2023

(54) PACKAGE ARCHITECTURE INCLUDING THERMOELECTRIC COOLER STRUCTURES

(71) Applicant: Intel Corporation, Santa Clara, CA (US)

(72) Inventors: Krishna Vasanth Valavala, Chandler, AZ (US); Ravindranath Mahajan, Chandler, AZ (US); Chandra Mohan Jha, Chandler, AZ (US); Kelly Lofgreen, Phoenix, AZ (US); Weihua Tang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1198 days.

(21) Appl. No.: 16/149,909

(22) Filed: Oct. 2, 2018

(65) Prior Publication Data

US 2020/0105639 A1   Apr. 2, 2020

(51) Int. Cl.

| *H01L 23/373* | (2006.01) |
| *H01L 23/31* | (2006.01) |
| *H01L 23/38* | (2006.01) |
| *H01L 29/43* | (2006.01) |
| *H01L 25/18* | (2023.01) |
| *H10N 10/17* | (2023.01) |

(52) U.S. Cl.
CPC ........ *H01L 23/373* (2013.01); *H01L 23/3114* (2013.01); *H01L 23/38* (2013.01); *H01L 25/18* (2013.01); *H01L 29/43* (2013.01); *H10N 10/17* (2023.02)

(58) Field of Classification Search
CPC ........... H01L 23/38; H01L 23/42–4338; H01L 33/645; H01L 25/0652; H01L 25/071; H01L 25/112; H10N 10/17
See application file for complete search history.

(56) References Cited

U.S. PATENT DOCUMENTS

| 2004/0113265 A1* | 6/2004 | DiBattista | ............. H01L 23/473 |
| | | | 257/E23.098 |
| 2013/0139524 A1* | 6/2013 | Kim | ........................ H01L 25/18 |
| | | | 62/3.7 |
| 2014/0254092 A1* | 9/2014 | Im | ........................... H01L 25/18 |
| | | | 361/688 |
| 2019/0067157 A1* | 2/2019 | Lin | ........................ H01L 21/565 |

* cited by examiner

*Primary Examiner* — Laura M Menz
*Assistant Examiner* — Candice Chan
(74) *Attorney, Agent, or Firm* — Essential Patents Group, LLP

(57) ABSTRACT

Embodiments include a microelectronic device package structure having a first die on the substrate. One or more additional dice are on the first die, and a thermal electric cooler (TEC) is on the first die adjacent at least one of the one or more additional dice. A dummy die is on the TEC, wherein the dummy die is thermally coupled to the first die.

14 Claims, 16 Drawing Sheets

//PACKAGE ARCHITECTURE INCLUDING THERMOELECTRIC COOLER STRUCTURES

TECHNICAL FIELD

Embodiments of the present description generally relate to the field of microelectronic packaging, and, more particularly, to microelectronic packages including thermoelectric cooler structures.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. Mobile products, such as cell phones, for example, often have microelectronic packages with small form factors which can pose many thermal challenges. One such challenge is that of cooling a device, such as an integrated circuit, within a microelectronic package, when the device may be close to a localized hot spot, Such hot spots may occur due to spikes in current flow rates at local bottlenecks in the circuitry of the packaged die. Adequate cooling of devices is necessary to prevent device failure at extended elevated temperatures, and to ensure reliable operation of the device.

Thermoelectric cooler (TEC) elements have been employed within package structures for cooling devices located therein. A TEC may cool a device within a microelectronic package according to the Peltier effect, where upon the passage of an electrical current through a junction including two dissimilar electrically conductive materials, a cooling effect can occur at the junction. A heating effect occurs if the current is reversed. P and N-type semiconductor materials can be used for fabricating TEC elements, where a semiconductor material may be doped with either a P-type dopant or an N-type dopant on either side of the junction, for example.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
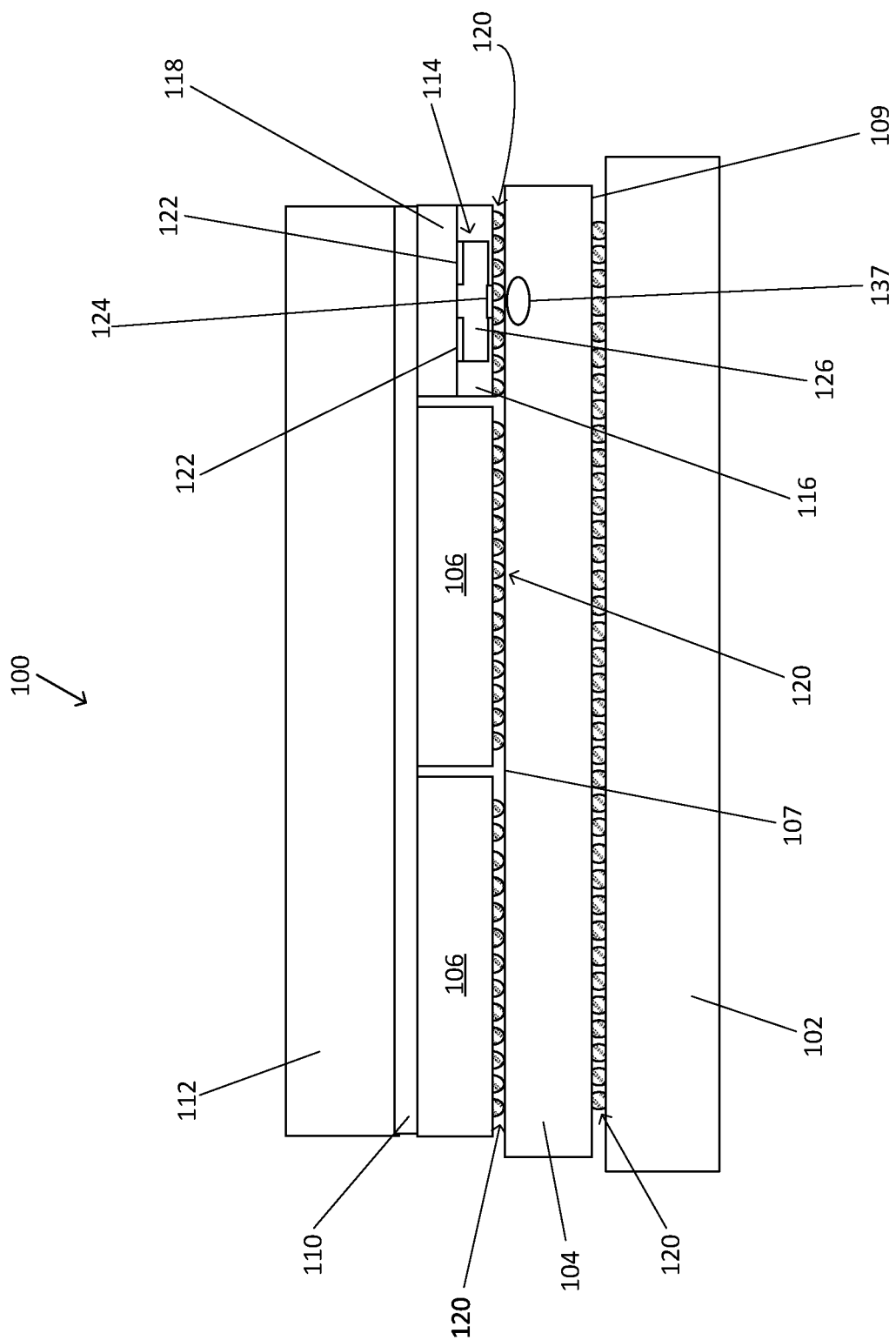
FIGS. 1A-1B illustrate cross-sectional views of stacked package structures having a TEC element, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures may be absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, the front-side may be referred to as the "active surface" of the die. A number of interconnects may extend from the die's front-side to an underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate.

Described herein are microelectronic packaging structures, such as stacked die package structures, having at least one TEC structure on a first surface of a first die, which may comprise an integrated circuit die. One or more additional dice may be on the first surface of the first die, adjacent to the TEC. The TEC may be physically coupled with a dummy die, such as a dummy die comprising silicon, for example, on a surface of the TEC. The TEC may have a cold side electrode thermally coupled to the surface of the first die, and a hot side electrode may be thermally coupled to the dummy die. In an embodiment, the TEC may comprise a thermoelectric material, such as bismuth telluride, for example, where alternating sections of the thermoelectric material may be doped with either a P-type dopant or an N-type dopant. The hot electrode may be on a first side of the thermoelectric material, and the cold side electrode may be on a second side of the thermoelectric material, opposite the first side of the thermoelectric material. A footprint of the hot side electrode may be offset from a footprint of the cold side electrode.

In an embodiment, one or more TEC structures may be on a first die. In an embodiment, a thermal solution, such as a heat sink, for example, may be thermally coupled with the dummy die disposed on hot side electrode of the TEC. A second surface of the first die may be on a substrate, in an embodiment, such as an interposer, for example. The TEC structures provide for cooling of the devices within the package, in locations where hot spots may increase local temperatures within the microelectronic package. By incorporating one or more TEC structures onto the surface of the first die, local hot spot temperatures may be cooled to reduce failure of devices within a package structure.

Some embodiments include applying a gating voltage to the TEC structure. The dummy die may be grounded, or may be gated, in some embodiments. The one or more TEC structures provide a thermal path for cooling devices within a package structure.

FIG. 1A is a cross-sectional view of a package structure 100, arranged in accordance with some embodiments of the present disclosure, having one or more thermoelectric cooler (TEC) structures 114 on a first side 107 of a first die 104. The package structure 100 additionally includes one or more dice 106 electrically and physically coupled to the first side 107 of the first die 104, adjacent to the one or more TEC structures 114. A second side 109 of the first die 104 may be disposed on a substrate 102. The substrate 102 may comprise a portion of a system in package substrate, a printed circuit board, an interposer, or any other suitable substrate according to a particular application. The substrate 102 may include such materials as phenolic cotton paper (e.g., FR-1), cotton paper and epoxy materials (e.g., FR-3), woven glass materials that are laminated together using an epoxy resin (e.g., FR-4), glass/paper with epoxy resin (e.g., CEM-1), glass composite with epoxy resin, woven glass cloth with polytetrafluoroethylene (e.g., PTFE CCL), or other polytetrafluoroethylene based prepreg material.

The substrate 102 may include conductive interconnect structures/routing layers (not shown) that are within dielectric layer(s), which may be configured to route electrical signals between any number of dice 116 and the substrate 102, in some embodiments. For example, interconnect structures may include routing structures such as pads or traces configured to receive electrical signals to and from devices that may be on or within the substrate 102. In some embodiments, individual ones of the conductive interconnect structures/routing layers comprise trenches, ground planes, power planes, re-distribution layers (RDLs), and/or any other appropriate electrical routing features. The dielectric layers and the conductive layers/structures within and on the dielectric layers of the substrate 102 are sometimes referred to as a "package substrate." The substrate 102 may also provide structural support for discrete components and/or any other type of device electrically coupled to the substrate 102.

Various types of substrates and substrate materials may find use with the disclosed embodiments (e.g., ceramics, sapphire, glass, etc.). The substrate 102 may be any substrate known to be suitable for one or more of flip-chip packages (FCBGA), package-on-package (PoP), system-in-package (SiP), or the like.

The first die 104 and/or the additional dice 106 may be an integrated circuit, or any other type of suitable die. In some embodiments, the dice 104, 106 may be any type of dice which consumes a large amount of power, such as a die requiring more than 1 Watt to operate (such as a system on a chip) for example. Such dice may generate a significant amount of heat, and may require sufficient cooling to maintain an acceptable operating environment, in order to avoid adversely affecting the operations of the die 104, 106, and possibly neighboring die/components that may be adjacent the dice 104, 106 on the substrate 102.

The dice 104, 106 may be any type of integrated device or integrated component that may be included within an electronic device package. In some embodiments, the dice 104, 106 may include a processing system (either single core or multi-core). In some embodiments, the dice 104, 106 may be a microprocessor, a graphics processor, a signal processor, a network processor, a chipset, a memory device etc. In some embodiments, the dice 104, 106 may be a system-on-chip (SoC) having multiple functional units (eg. one or more processing units, one or more graphics units, one or more communications units, one or more signal processing units, one or more security units, etc.).

In some embodiments, the first die 104 may be attached to a surface of the substrate 102 according to a variety of suitable configurations including a flip chip configuration, or any other suitable attachment configuration. The first side 107 of the die 104 may comprise a backside of the die, and may be electrically and thermally coupled to the additional dice 106. The additional dice 106 may be attached to the first side 107 of the first die 104 by interconnect features 120, which may comprise such conductive features as bumps or pillars, which serve to route electrical signals, such as I/O, power and/or ground signals, associated with the operation of the dice 106. In some embodiments, the wire bonding or the flip chip connections may comprise conductive materials such as copper, gold and nickel.

The second side 109 of the first die 104 may be an active side of the first die 104, and may be attached to a surface of the substrate 102, using interconnect features 120, which may comprise such conductive features as bumps or pillars, which serve to route electrical signals, associated with the operation of the die 104. In some embodiments, the wire bonding or the flip chip connections may comprise conductive materials such as copper, gold and nickel.

In an embodiment, interconnect structures 120 may comprise conductive materials such as solder materials. The interconnect structures 120 may comprise an array of ball grid array (BGA) structures, in an embodiment.

One or more TEC structures 114 may be on the first surface 107 of the first die 104, and may be located in any desired location on the first side 107 of the die 104. In an embodiment, the TEC 114 may comprise a thermal electric material 126 with electrodes 122, 124 on either side of the thermal electric material 126. A dielectric material 116 may be adjacent the TEC 114, and in some embodiments the dielectric material may comprise a mold compound. In an embodiment, the TEC 114 may be attached to the first die 104 in locations which may be prone to experience local hotspots, such as the hotspot 137 depicted in FIG. 1A. The hotspots may comprise a localized increase in temperature due to such factors current flow rates at bottleneck locations within device circuitry, for example, within localized areas of the first die 104. The TEC 114 serves to cool, i.e. reduce the temperature in the area of the hotspot, such as the hotspot 137.

In an embodiment, the thermoelectric material 126 may comprise such materials as bismuth, telluride, antimony, lead, silicon, or germanium, or any other suitable type of thermoelectric material 126. Portions of the thermoelectric material 126 may be doped with conventional N-type dopants, such as, for example phosphorous, arsenic, antimony, bismuth, selenium, and tellurium, to form P-type sections of the thermoelectronic material 126. P-type dopants, such as boron, aluminum, or gallium, and indium, may be used to form P-type sections of the thermal electric material 126. The thermoelectric material 126 may comprise alternating sections of P-type and N-type doped sections. In an embodiment, the P-type and N-type sections of the thermoelectric material 126 may be separated/isolated from each other by a dielectric material, or they may be separated from each other by an air gap.

Electrode 122 disposed on a surface of the thermoelectric material 126 may comprise a hot side electrode 122 in an embodiment, and may be physically and thermally coupled with a dummy die 118. The dummy die 118 may comprise silicon in an embodiment. The dummy die 118 provides a thermal pathway for heat emanating from the first die 104, which may be due to heat heat generated from the local hotspot 137, for example. A cold side electrode 124, disposed on the thermoelectric material 126, on a side opposite the hot side electrode 122, may have a footprint that is offset from a footprint of the hot side electrode 122. In an embodiment, the cold side electrode 124 and the hot side electrode 122 may possess a radial geometry, where a radius of the cold side electrode 124 may have a smaller radius than a radius of the hot side electrodes 122. In an embodiment, the hot side electrode 122 is not disposed over the cold side electrode 124. The electrodes 122, 124 may comprise any suitable conductive material, such as copper or copper alloys, for example, or any other suitable conductive material.

Figure 1B:
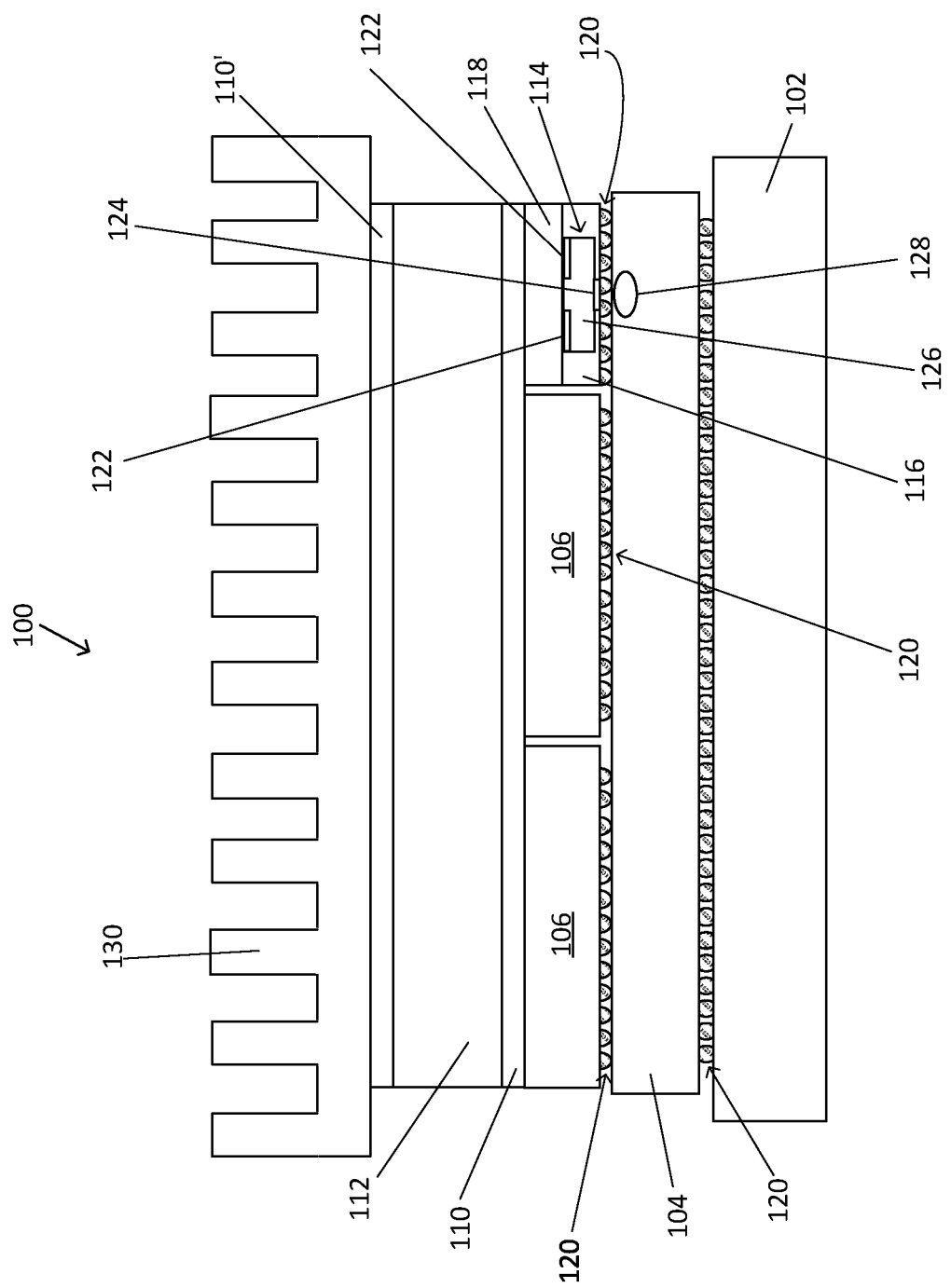

A thermal interface material (TIM) 110 may be on top surfaces of the additional dice 106 and on a top surface of the dummy die 118, where the TIM may be coplanar with the top surfaces of the dice 106 and the top surface of the dummy die 118. The dummy die 118 may provide a thermal pathway from the local hotspot 137 to a thermal solution 112, such as an integrated heat spreader, for example, that may be disposed on the TIM 110. FIG. 1B depicts an embodiment wherein the package structure 100 comprises a heat sink 130 disposed on the thermal solution 112, which provides a thermal pathway for further cooling of the first die 104, and any other adjacent components to the first die 104.

Figure 1C:
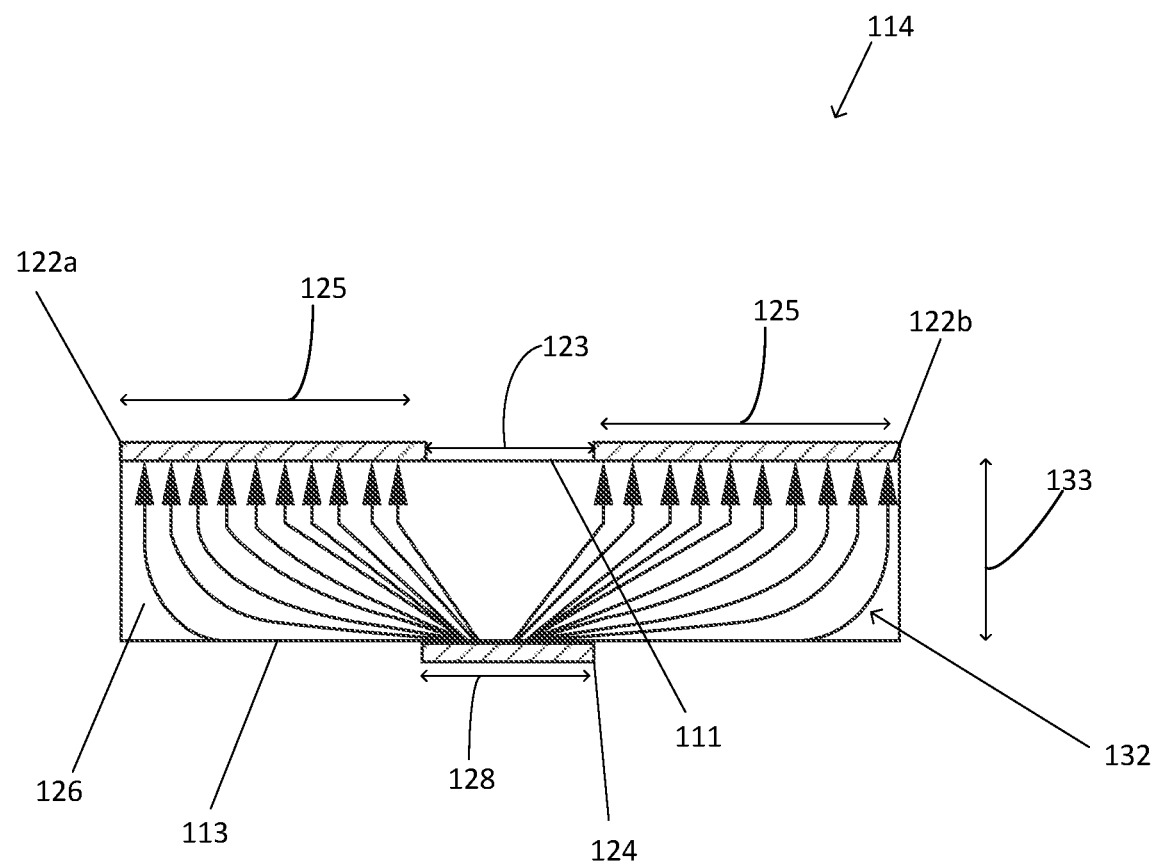
FIGS. 1C-1D illustrates cross-sectional views of TEC structures, according to embodiments.

In FIG. 1C depicts a cross-sectional view of a TEC structure 114, wherein the hot side electrode 122 is on a first side 111 of the thermoelectric material 126, and the cold side electrode 124 is on a second side 113 of the thermoelectric material 126. In an embodiment, the hot side electrode 122 may comprise a circular structure when viewed from a top view (such as the hot electrode 122 geometry depicted in FIG. 1E, for example). In other embodiments, the hot side electrode 122 may comprise any other suitable geometries, such as a rectangular, or a triangular geometry, for example. In an embodiment, a first portion 122a of the hot side electrode 122 (comprising a radial electrode geometry) and a second portion 122b of the hot electrode 122 may possess a distance 123 between the first portion 122a and the second portion 122b.

The distance 123 is over the cold side electrode 124, such that a footprint 128 of the cold side electrode 124 is offset from a footprint 125 of the first and second portions 122a, 122b of the hot side electrode 122. Current and thermal pathways 132 are capable of pumping heat (from a local hotspot) from the cold side electrode 124 and thermally transferring the heat towards the hot electrode 122, thus cooling the first die. Since the hot electrode 122 has a larger radius and a larger surface area than the cold side electrode 124, heat density decreases quickly over a small z height/thickness 133 of the thermoelectric material 126. In an embodiment, the thickness 133 of the thermoelectric material 126 may be from about 10 microns to about 100 microns.

Figure 1D:
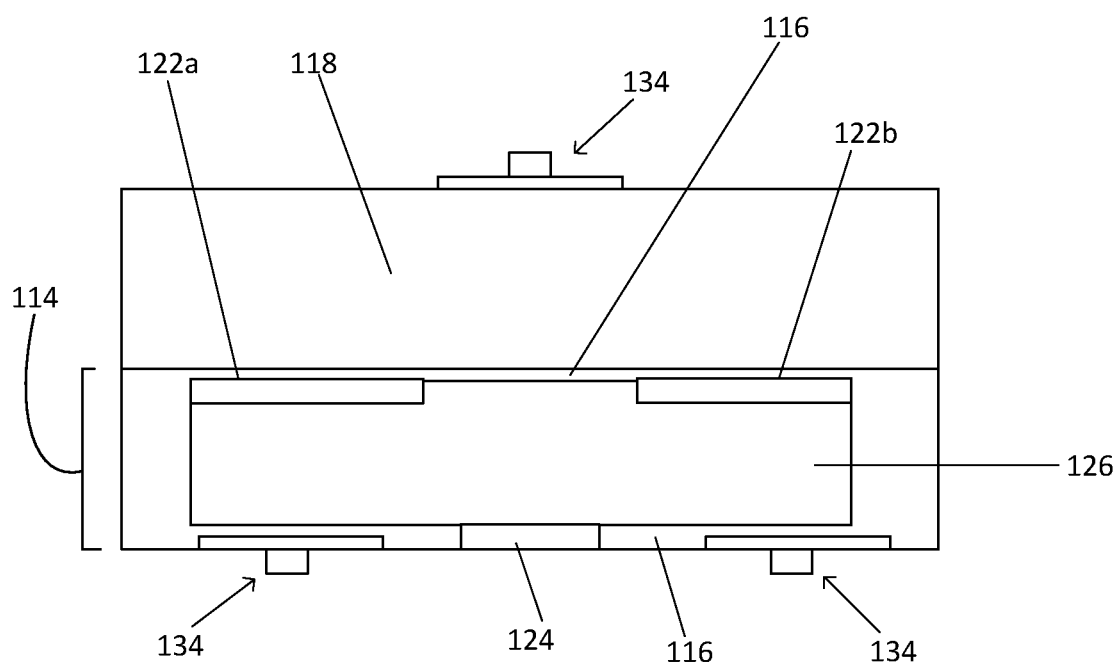

In an embodiment, the TEC 114 may have a gate voltage applied to further optimize cooling performance of the TEC 114. For example, gate electrode structures 134 may be formed adjacent the cold side electrode 124 on the TEC 114 structure (FIG. 1D). Because the thermoelectric material 126 may possess semiconductor electrical properties, by applying a gate voltage to the thermoelectric material 126 the number of carriers in the thermoelectric material 126 (and thus its Fermi level) can be tuned. This results in changing electrical conductivity and the Seebeck coefficient, zT, of the thermoelectric material 126. Applying a gate voltage, which can maximizes the zT of the thermoelectric material 126, can boost the performance of the TEC 114. In an embodiment, the gate voltage can be applied through conductive bumps located on the first die, while grounding one of the hot side or the cold side electrodes. In another embodiment, the dummy die 118 can be gated with a gate electrode 134 to apply a gating voltage from both the top and the bottom of the TEC 114 structure. In an embodiment, the dummy die 118 may be grounded or back gated.

Figure 1E:
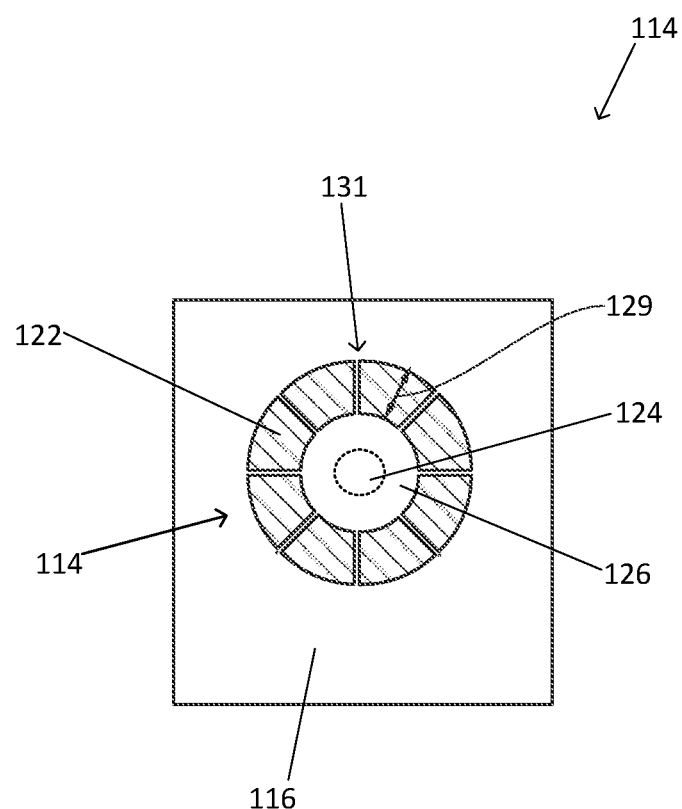
FIGS. 1E-1F illustrates top views of TEC structures, according to embodiments.

FIG. 1E depicts a top view of the TEC 114. The hot side electrode 122 as shown comprises a radial geometry. The hot side electrode 122 possesses a radius 129, wherein the radius 129 may be about twice a radius of the cold side electrode 124. The hot side electrode 122 portion may comprise segments of conductive material, such as copper for example, that are separated by a dielectric material 131 in some cases, or may be separated by an air gap 131 in other instances. The hot side electrode 122 is disposed over the thermoelectric material 126. The footprint of the cold side electrode 124 is offset from the footprint of the hot side electrode 122. The TEC 114 may be adjacent a dielectric material 116.

Figure 1F:
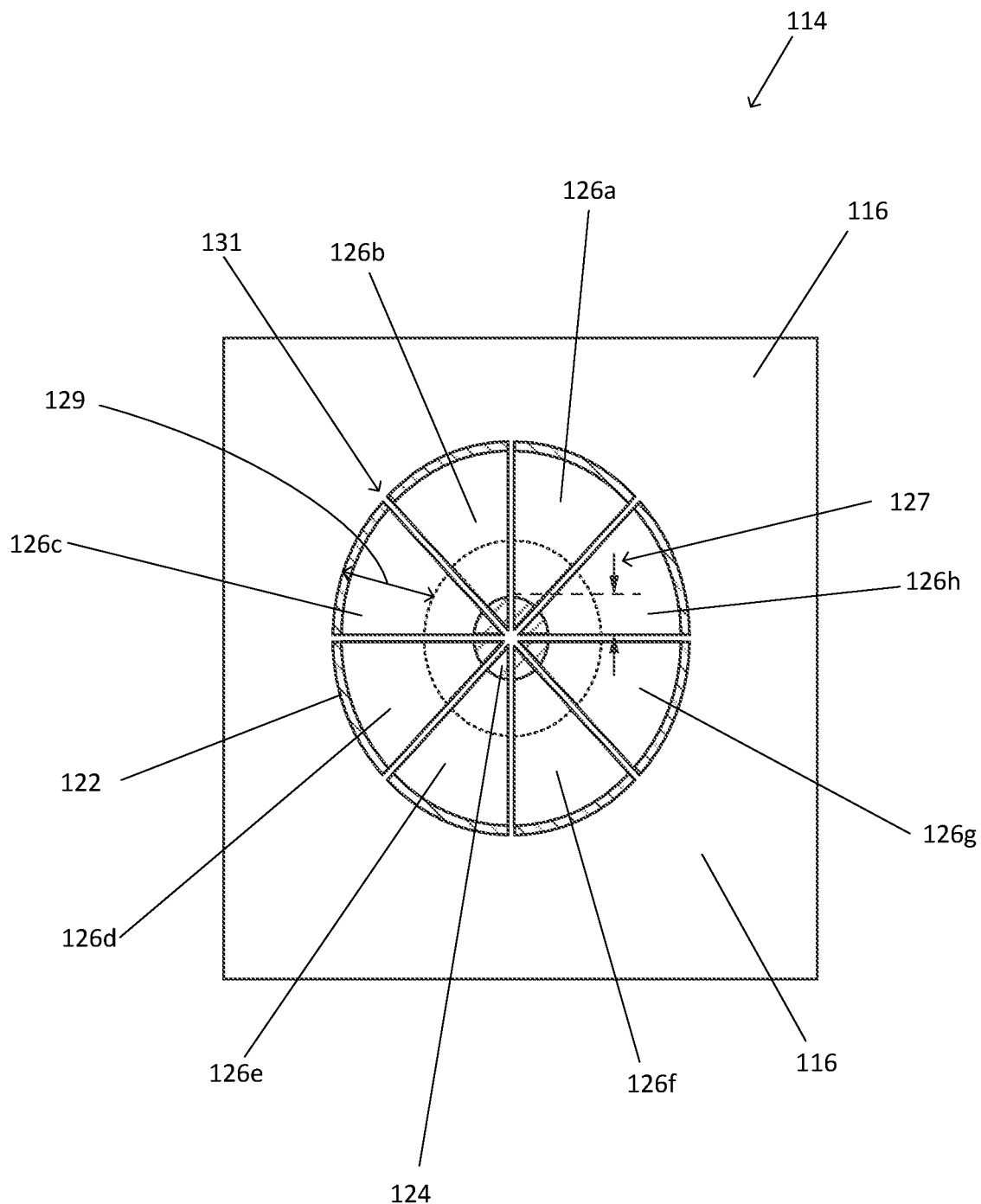

FIG. 1F depicts a bottom view of the TEC 114. The thermoelectric material 126 comprises a plurality of segments 126a-126h, that are separated/isolated from each other by a gap 131. The gap 131 may comprise a dielectric material, or may comprise a physical space between the individual segments of the thermoelectric material 126. In an embodiment, the plurality of segments 126a-126h may comprise alternating P-type and N-type doped segments if the thermoelectronic material 126. In an embodiment, the individual segments 126a-126h form a series of pi-leg junctions. In an embodiment, the cold side electrode 124 comprises a radius 127 that is about one third of the radius of the hot side electrode 122. In an embodiment, the footprint of the cold side electrode 124 is within the footprint of the hot side electrode 122.

Figure 1G:
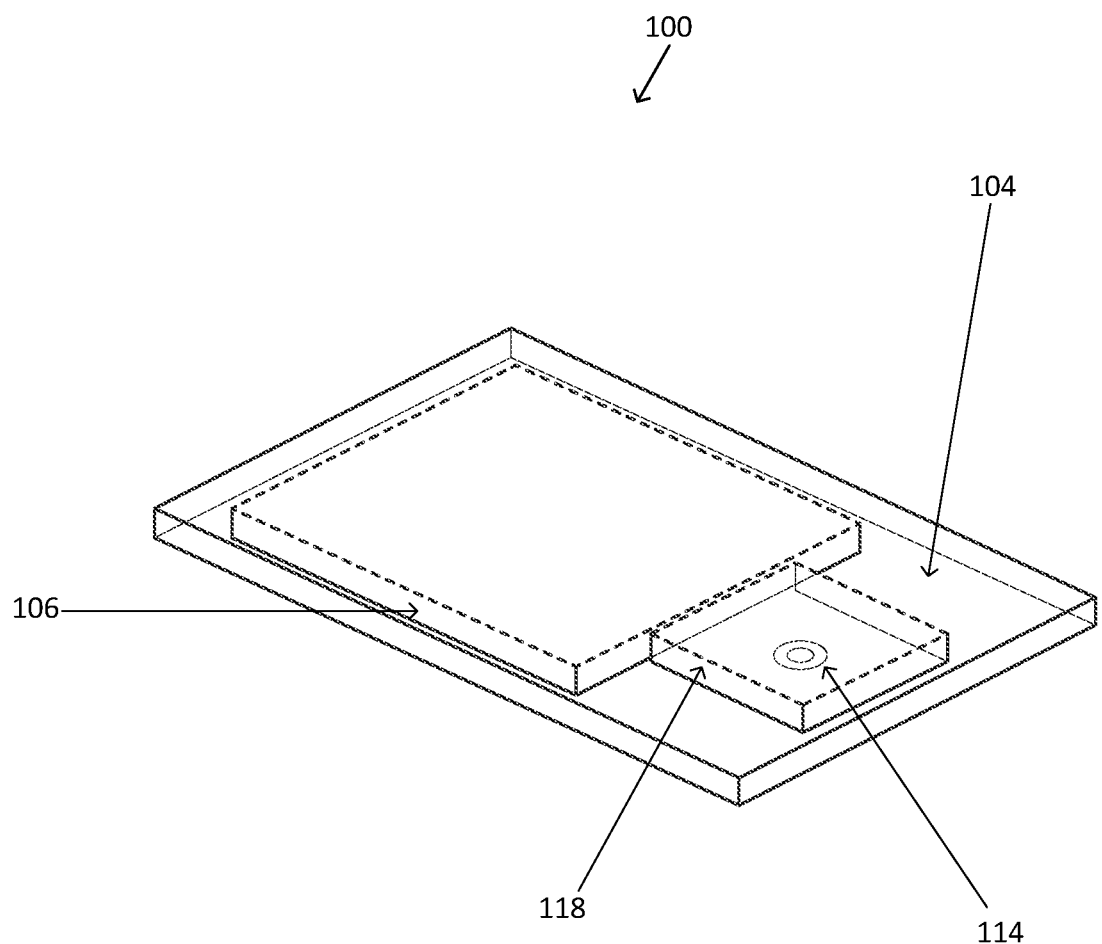
FIG. 1G illustrates a side perspective view of a package structure having a TEC structure, according to embodiments.

In FIG. 1G, a side perspective view of a portion of the package structure 100 is shown. An additional die 106 is on the surface of the bottom die 104. The TEC 114 is adjacent the additional die 106, and is on the surface of the bottom die 104. The dummy die 118 is on the surface of the TEC 114. In an embodiment, the top surface of the dummy die 118 may be substantially coplanar with the top surface of the additional die 106. In an embodiment, any number of additional die 106 may be located on the surface of the bottom die 104, and any number of the TEC 114 (including the dummy die 118) may be on the surface of the bottom die 104.

The number and location of the TEC 114 on the top surface of the bottom die 104 may be optimized depending on design requirements, particularly with respect to location of hotspots. By providing a cooling mechanism for the local hotspots, such as the local hotspot 137 of the package structure 100 of FIG. 1A, for example, greater cooling of the package structure 100 is enabled, thus enabling increased device performance. The one or more TEC 114 structures protect the devices located within a package structure, such as package structure 100 of FIG. 1A, for example, from being damaged by excessive heat.

The embodiments described herein allow the cooling of devices within a microelectronic package. In an embodiment, the TEC structures of the embodiments herein enable and enhance cooling of a bottom die within a stacked die package, which may be have portion covered by a mold material, and not covered by an additional device on a top surface. The various embodiments included herein enable the bottom die temperature to be maintained at acceptable levels during peak current demand.

Figure 2:
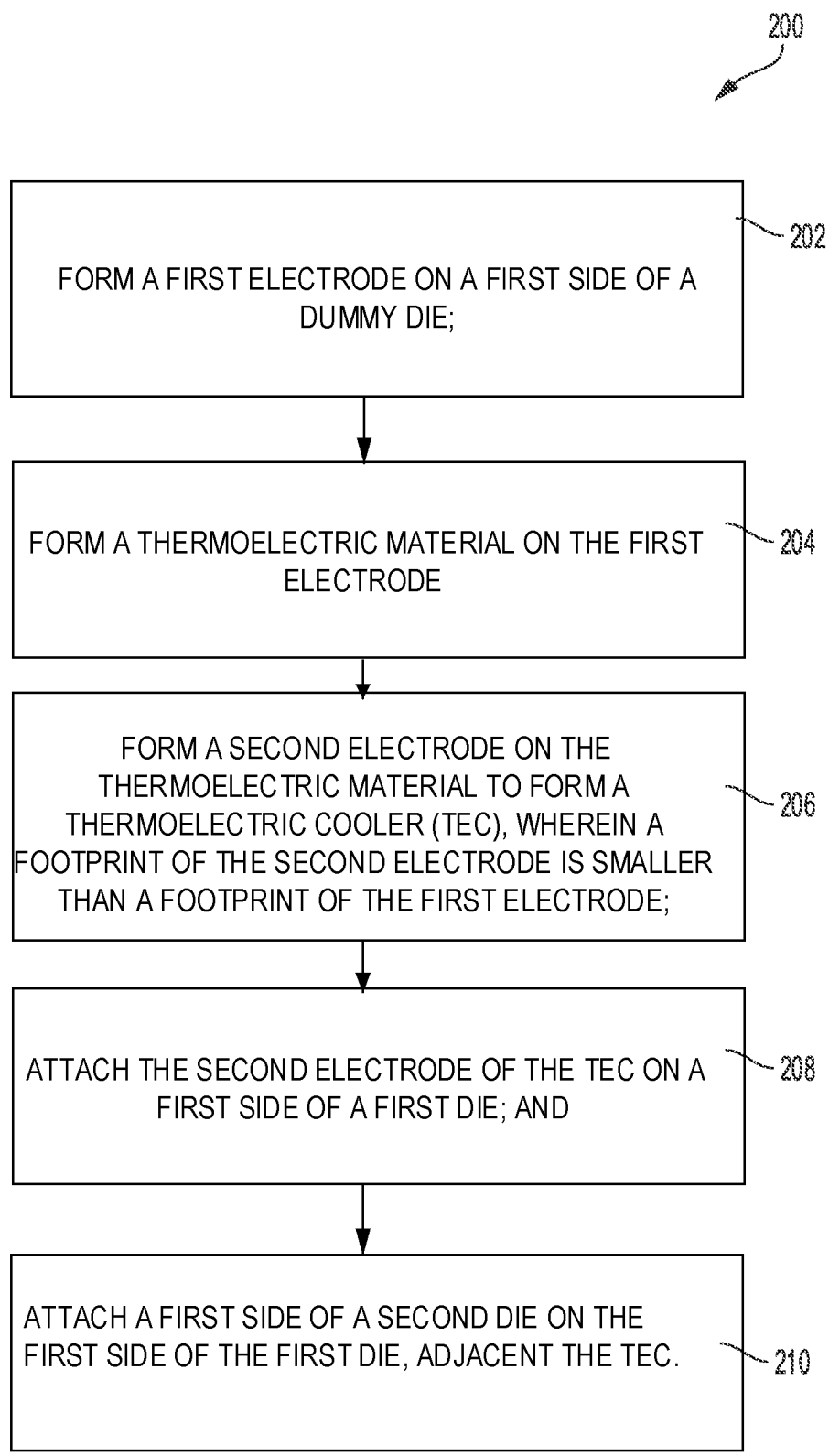
FIG. 2 is a flow diagram illustrating a method of fabricating package structures having TEC structures, according to embodiments.

FIG. 2 depicts a flow chart of an embodiment of a method 200 of forming a TEC structure on a first die, such as a bottom die within a stacked package structure, for example. In other embodiments, the bottom die may be located within any type of suitable package structure, including non-stacked microelectronic package structures. The TEC structures described herein enable the cooling of the bottom die, which may experience a local rise in temperature due to localized hot spots. The bottom die may include additional die adjacent the TEC structure. The method 200 may share any or all characteristics with any other methods discussed herein, such as, not limited to, the methods disclosed in FIGS. 3A-3I. For example, FIGS. 3A-3I may show cross-sectional views of structures employing any of the operations described in method 200. It should be noted that the order of the operations of method 200 may be varied, according to a particular application.

At operation 202, a first electrode may be formed on a first side of a dummy die. In an embodiment, the first electrode may comprise a conductive material, such as copper or copper alloys, for example. In an embodiment, the first electrode 122 may comprise 122 an additional electrically conductive material which can form a low electrical resistance contact at an interface with a particular thermoelectric material, such as nickel or aluminum, for example. The first electrode may comprise any geometry, such as a radial geometry or a rectangular geometry, for example. The dummy die may comprise a silicon material in an embodiment. The first electrode may be formed on the dummy die by utilizing any suitable formation processes, such as physical vapor deposition followed by lithographic and etching techniques, for example. In an embodiment, the first electrode may comprise a radial geometry, where the first electrode is segmented into individual portions, separated from each other by a gap. In an embodiment, the first electrode may comprise a thickness of between about 1 micron to about 10 microns.

In an embodiment, the dummy die may comprise a thickness of between about 100 microns to about 200 microns, but may comprise other thicknesses according to the particular design requirements. In an embodiment, the dummy die may comprise any suitable material that is thermally conductive, such as silicon, copper, and/or or ceramics materials, such as aluminum nitride, or silicon carbide, for example. At operation 204, a thermoelectric material may be formed on the first electrode. The thermoelectric material may include materials that are thermally conductive, electrically conductive, and/or possess a high Seebeck coefficient. The thermoelectric material may include materials comprising bismuth or tellurium, for example. In another embodiment, the thermoelectric material may additionally comprise antimony, lead, silicon, germanium, transition metal chalcogenides, and/or alloys of pnictogen chalcogenides. In yet another embodiment, the thermoelectric material may comprise nanostructured materials such as thin films, superlattices, and/or nanowires of suitable materials. In an embodiment, the thermoelectric material may comprise a thermal conductivity of between about 0.1 W/KM to about 150 W/Km. In an embodiment, the thermoelectric material may be both thermally and electrically conductive.

In an embodiment, the thermoelectric material may be patterned and etched to be in alignment with the underlying conductive first electrode pattern. The thermoelectric material may be doped with P-type or N-type dopants, such as boron or phosphorus respectively, for example. The patterned thermoelectric material may be doped by using such processing techniques as ion implantation, alloying, or vapor deposition, for example, or any other suitable doping technique. In an embodiment, thermoelectric material may be grown on a disposable surface with appropriate doping and transferred onto the first electrode. In an embodiment, the thermoelectric material may comprise a thickness of between about 20 microns to about 100 microns, but may comprise any suitable thickness, according to a particular application. In an embodiment, the thickness of the thermoelectric material may be less than the thickness of the dummy die. In an embodiment, the thickness of the thermoelectric material may be less than about half of the thickness of the dummy die.

At operation 206, a second electrode may be formed on the thermoelectric material. In an embodiment, the second electrode may comprise a conductive material, such as copper or copper alloys, for example. In an embodiment, the second electrode may comprise an additional electrically conductive material, such as a nickel or aluminum material, for example, to facilitate ohmic contact formation between the thermoelectric material and the second electrode. which can form low electrical resistance contact with the chosen thermoelectric material. The second electrode may comprise any geometry, such as a radial geometry or a rectangular geometry, for example. The second electrode may be formed on the dummy die by utilizing any suitable formation processes, such as physical vapor deposition followed by lithographic and etching techniques, for example In an embodiment, a footprint of the first electrode may be larger than a footprint of the second electrode. In an embodiment, the footprint of the first electrode may be offset from the footprint of the second electrode. For example, the first electrode may comprise a radial geometry, where the radius of the first electrode may be between about 4 mm to about 6 mm. The second electrode may comprise a radial geometry, where the radius of the second electrode may be between about 0.5 mm to about 1.5 mm. The footprint of the second electrode may be within the footprint of the first electrode. In an embodiment, the footprint of the second electrode may be between a first portion of the first electrode and a second portion of the second electrode, where the first portion and the second portion are on opposite sides of the of each other. In an embodiment, the first electrode, the thermoelectric material, and the second electrode may comprise a TEC structure.

At operation 208, the second electrode of the TEC may be attached on a first side of a first die. In an embodiment, the first die may comprise any suitable type of microelectronic device, such as a microprocessor for example. The first side of the first die may include a plurality of interconnect features on the first side, that may comprise conductive bumps, such as C4 bumps or balls, or wire structures, in some embodiments. The plurality of interconnect features may be formed in any variety of manners, such as, but not limited to plating processes, printing and reflow processes or wire bonding, for example.

The TEC may be thermally and electrically coupled to the first die, through the plurality of interconnect features. One or more TEC structures may be placed on the first die where hotspots may have a tendency to occur during the operation of the first die. For example, a TEC structure may be placed on the first side of the first die at one or more locations where the first die may operate at a high power/high current levels.

At operation 210, a second die may be attached to the first side of the first die, adjacent to the TEC structure. In an embodiment a mold compound may be adjacent to the TEC structure, and may be on the first surface of the first die, and may be adjacent to the second die. In an embodiment, the mold compound may comprise a dielectric material. The second die may comprise any suitable die, and may include such die as a memory die, for example. In an embodiment, the second die may comprise a thickness that is greater than a thickness of the first die. In an embodiment, any number of additional die may be placed adjacent to the TEC structure on the first side of the first die. A second side of the first die may be placed on a substrate, such as an interposer, or a motherboard, for example.

The second side of the first die may have a plurality of interconnect features, such as a plurality of solder balls, where the second side of the first die may be an active side of the first die, in some embodiments. The plurality of interconnect features may comprise metal, such as copper, aluminum or gold, for example, and may be in the shape of pillars or lands, in some cases. The plurality of interconnect features may be conductive bumps, such as C4 bumps or balls, or wire structures, in some embodiments. The plurality of interconnect features may be formed on the second side of the first die in any variety of manners, such as, but not limited to plating processes, printing and reflow processes or wire bonding, for example.

FIGS. 3A-3I depict cross-sectional views of structures formed by employing a process of fabricating package device structures comprising one or more TEC structures on a surface of a first die, where the first die is within a micro electronic package structure, such as a stacked package structure, for example. In other embodiments, the TEC structure may be on a first die, wherein the first die comprises a portion of any suitable type of package structure. The TEC structures described in the embodiments herein provide for local cooling of a device within a package structure by pumping heat from local hotspots, towards a dummy die on the surface of the TEC structure. In an embodiment the dummy die may then be thermally coupled to a thermal solution, such as a integrated heat spreader, which may in turn be thermally coupled to a heat sink, for example.

Figure 3A:
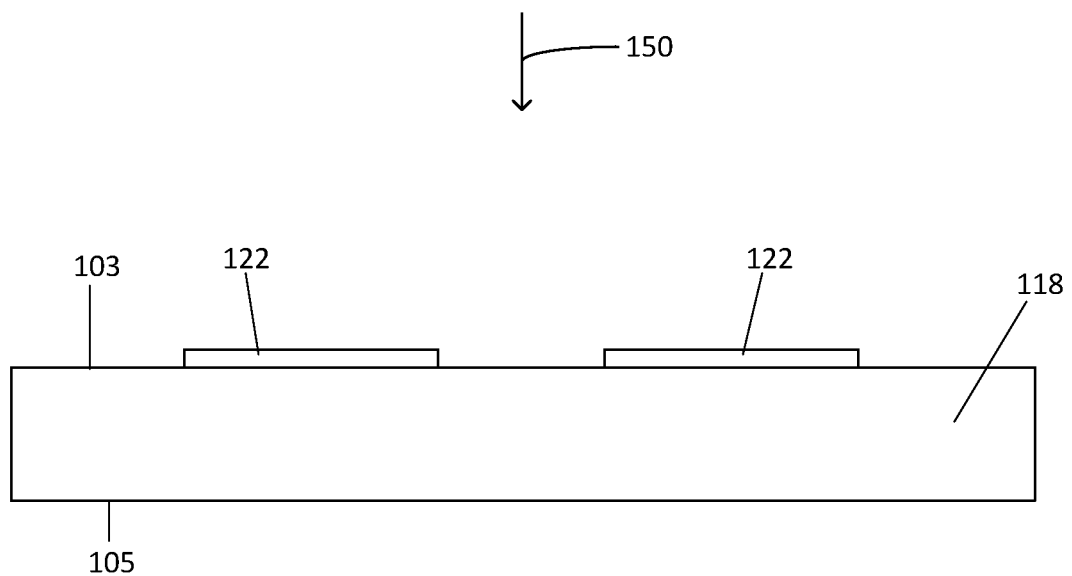
FIGS. 3A-3I illustrate cross-sectional views of package structures formed according to methods of fabricating package structures having TEC structures, according to embodiments.

In FIG. 3A, a dummy die 118 is depicted. In an embodiment the dummy die 118 may comprise a first side 103 and a second side 105. The dummy die 118 may comprise a silicon material, in an embodiment. The dummy die 118 may comprise a thermally conductive and electrically conductive material in an embodiment. A first electrode 122 may be formed on a first side of the dummy die 118 by utilizing a formation process 150. The formation process 150 may comprise a deposition process of any suitable conductive material, such as copper or copper alloy materials. In an embodiment, the deposition process may include a physical deposition process, such as of sputtering process for example, while in other embodiments, the deposition process of the conductive material may comprise an electroplating or an electrolysis formation process. The formation process 150 may further comprise patterning and etching the conductive material to form the first electrode 122 in a desired geometrical pattern on the first side 103 of the dummy die 118. In an embodiment, the first electrode 122 may comprise a radial geometry, and may comprise a radius such as is depicted in FIG. 1B (top view), for example.

Figure 3B:
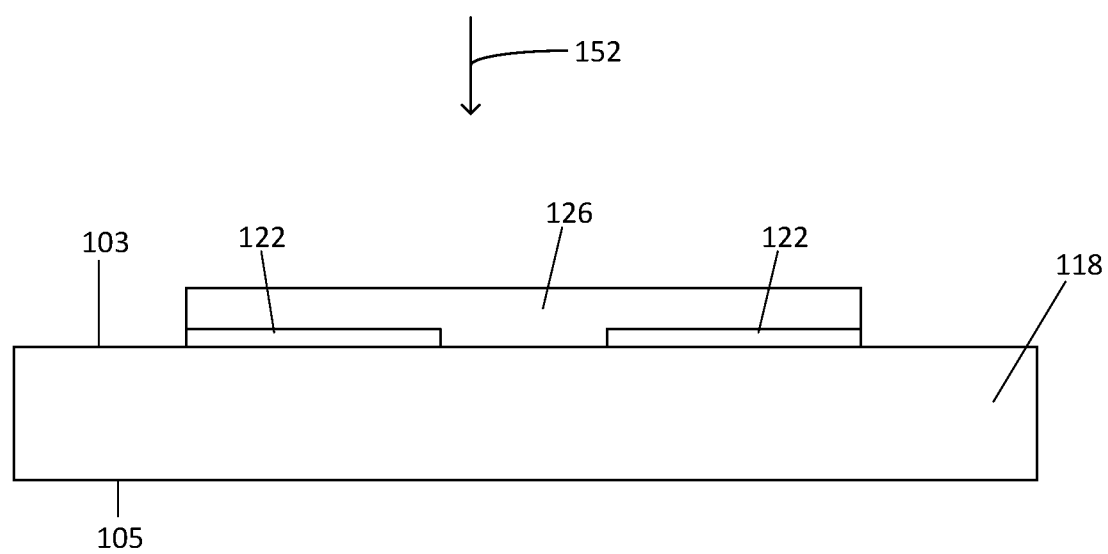

In FIG. 3B, a thermoelectric material 126 may be formed on the first side 103 of the dummy die 118, and on the first electrode 122, by using formation process 152. In an embodiment, the thermal electric material 126 may be formed by utilizing physical deposition process, such as sputtering for example, or may be formed by any other suitable formation process. In an embodiment, the thermoelectric material 126 may comprise a thickness of between about 20 microns to about 100 microns, in an embodiment, and may comprise a thermal conductivity of between about 1 to about 20 W/mK, in an embodiment. The thermoelectronic material 126 may comprise any suitable material, such as a thermally and electrically conductive material. In an embodiment, the thermoelectric material 126 may comprise such materials as bismuth telluride, and may also include materials comprising silicon, germanium, and/or antimony, for example. In an embodiment, the thermoelectric material may comprise a semiconductor material.

Figure 3C:
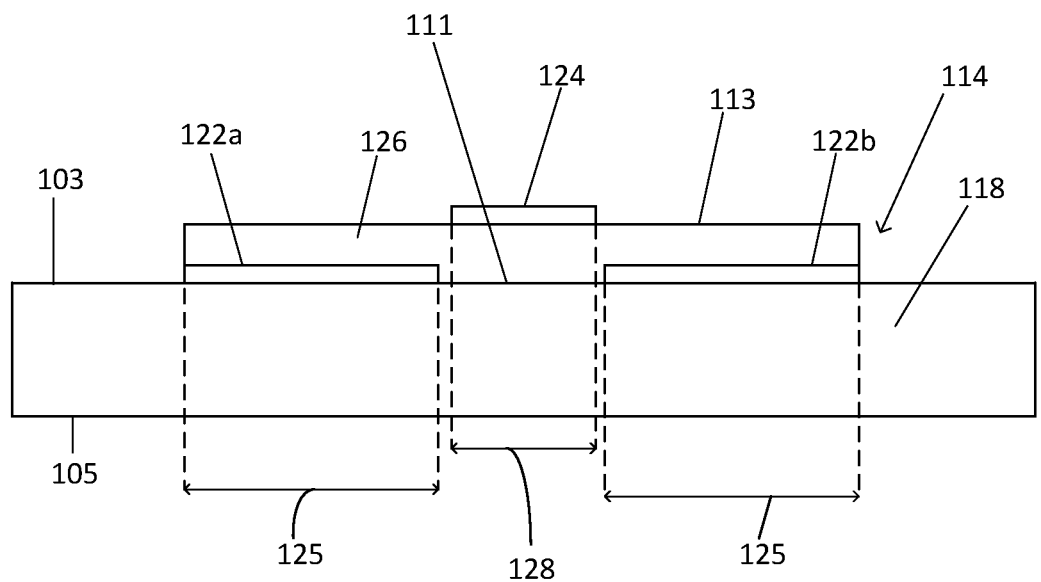

In an embodiment (not shown) the thermoelectric material 126 may be patterned into discrete segments, where alternating segments may be doped with a P-type or an N-type dopant material. In FIG. 3C, a second electrode 124 may be formed on a second side 113 of the thermoelectric material 126, opposite a first side 111 of the thermoelectric material 126. In an embodiment, the second electrode 124 may comprise a conductive material, such as a copper alloy for example. In an embodiment, the first electrode 122 may comprise a first portion 122a, and a second portion 122b, that is opposite the first portion 122a. In an embodiment, the first electrode 122 may comprise a hot side electrode, and the second electrode 124 may comprise a cold side electrode. In an embodiment, a TEC 114 structure comprises the first electrode 122, on the first side 111 of the thermoelectric material 126, with the second electrode 124 on the second side 113 of the thermoelectric material 126.

In an embodiment, the TEC 114 may comprise a radial geometry, such as that depicted in FIG. 1E, for example. In other embodiments, the TEC 114 may comprise other geometries such as a rectangular geometry, for example. In an embodiment a footprint 125 of the first electrode 122 may be greater than a footprint 128 of the second electrode 124. In an embodiment, the footprint 128 of the second electrode 124 may be less than about one half of the footprint 125 with the first electrode 122. In an embodiment, the footprint 128 of the second electrode 124 may be within the footprint 125 of the first electrode 122.

Figure 3D:
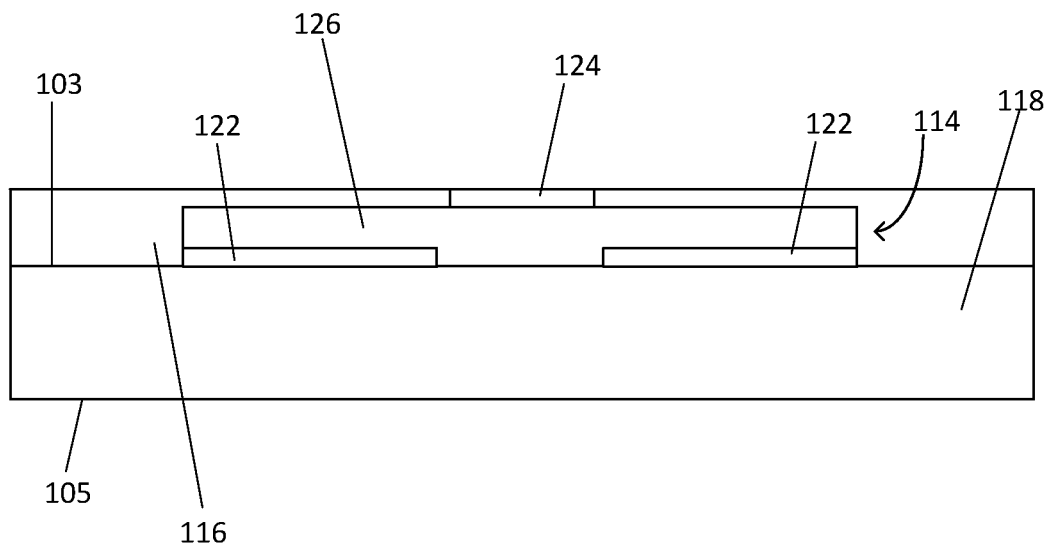
Figure 3E:
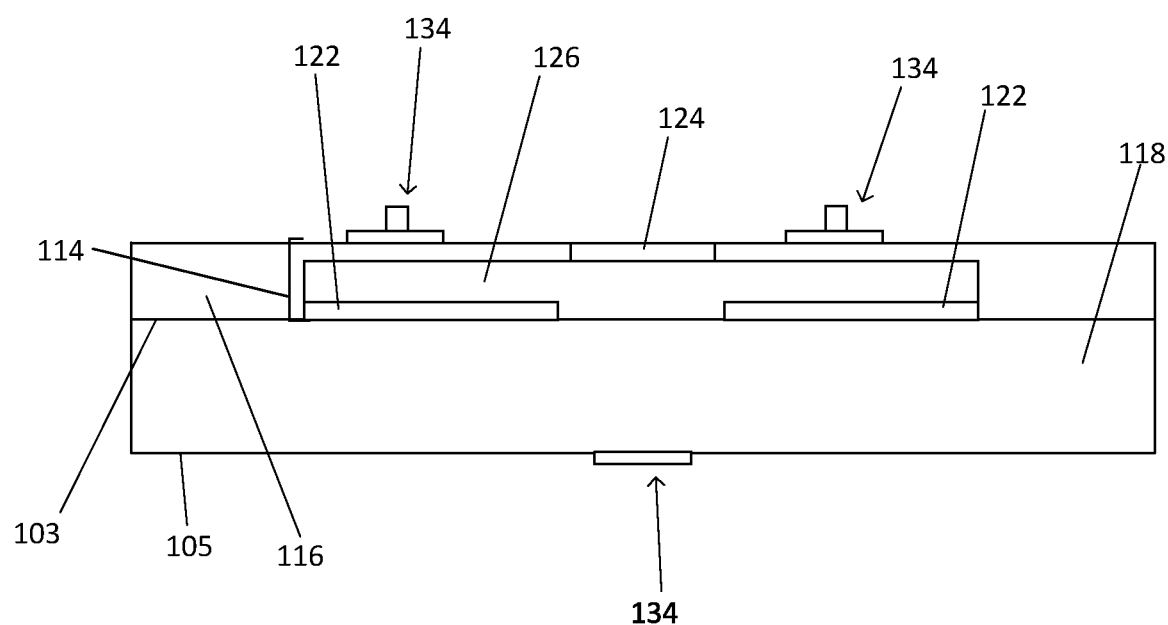

In FIG. 3D, a dielectric material 116 may optionally be formed on the top surface 103 of the dummy die 118, adjacent the TEC 114. Conductive structures (not shown), may be formed within the dielectric material 116, and may electrically connect electrodes 122, 124 to other elements within a package structure, such as package structure 100 of FIG. 1A for example. In an embodiment, a gate electrode 134 may be attached/formed on one or more of the thermoelectric material 126 or on the second side 105 of the dummy die 118 (FIG. 3E). In an embodiment, the gate electrodes 134 may comprise a conductive material, such as a copper or copper containing alloy material, for example, and may comprise any suitable geometry. In an embodiment, the cooling performance of the TEC 114 structure may be optimized by applying a gate voltage to one or more of the gate electrodes 134.

The thermoelectric material 126, which may comprise a semiconductor material, may be tuned in terms of the number of carriers (and therefore its Fermi level) such as holes or electrons, within the thermoelectric material 126. By applying a gate voltage to the gate electrode structures 134 that maximizes/tunes a Seebeck coefficient, zT (V/K) of the thermoelectric material 126, the cooling capabilities of the TEC 114 may be improved. In an embodiment, the gate voltage can be applied through interconnect structures that may be electrically coupled to the gate electrodes structures 134, upon attachment of the TEC 114 to a die, such as the first die 104 of FIG. 1A.

Figure 3F:
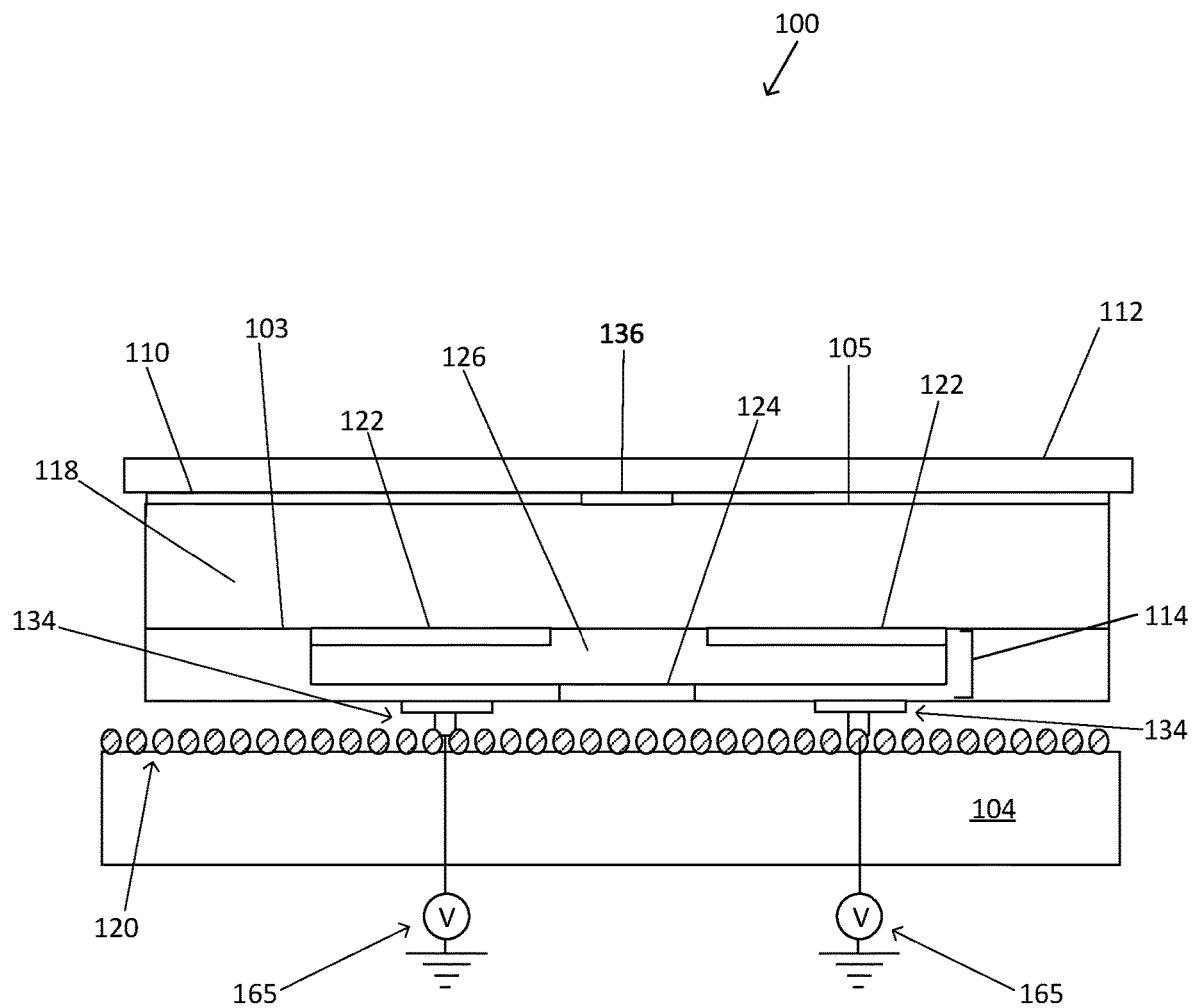

In FIG. 3F, a portion of a package structure 100 is shown. In an embodiment, a first die 104 may comprise a plurality of interconnect structures 120, which may comprise solder balls, such as an array of ball grid array (BGA) solder balls, for example. In other embodiments, the interconnect structures 120 may comprise any geometry, such as pillars for example and may comprise any suitable conductive material, such as copper for example. The interconnect structures 120 may be physically and electrically coupled to the TEC structure 114, and in an embodiment gate electrodes 134 may be electrically coupled with the interconnect structures 120. In an embodiment, a gate voltage 165 may be applied to the gate electrodes 134, and the cooling performance of the TEC 114 may be optimized by the application of the gate voltage 165. In an embodiment, the cold side or the hot side electrodes 124, 122, may be grounded.

For example, a cooling solution 112, which may comprise a heat spreader, such as a copper integrated heat spreader, for example, may be a grounded cooling solution 112. A thermal interface material (TIM) 110 may be disposed on the cooling solution 112, where the TIM 110 may also be on the second side 105 of the dummy die 118. In an embodiment the TIM 110 may comprise a conductive TIM, such as a solder material for example. In other embodiments, the TIM 110 may comprise any other suitable TIM 110 material. In an embodiment, the dummy die 118 may comprise a highly doped silicon material, with a conductive film disposed on its second side 105, and may comprise a dopant level of above about $1E18/cm^3$. In this case, a grounding element 136 is not necessary. In another embodiment, the TIM 110 may comprise an electrically insulating material, such as a thermal grease and/or a metal particle infused polymer. The grounding element 136 may be formed on the cooling solution 112, and may be attached to the dummy die 118, in order to ground the dummy die 118. Thus, the TEC 114 may be configured to comprise a top gated assembly, where the dummy die 118 is grounded.

Figure 3G:
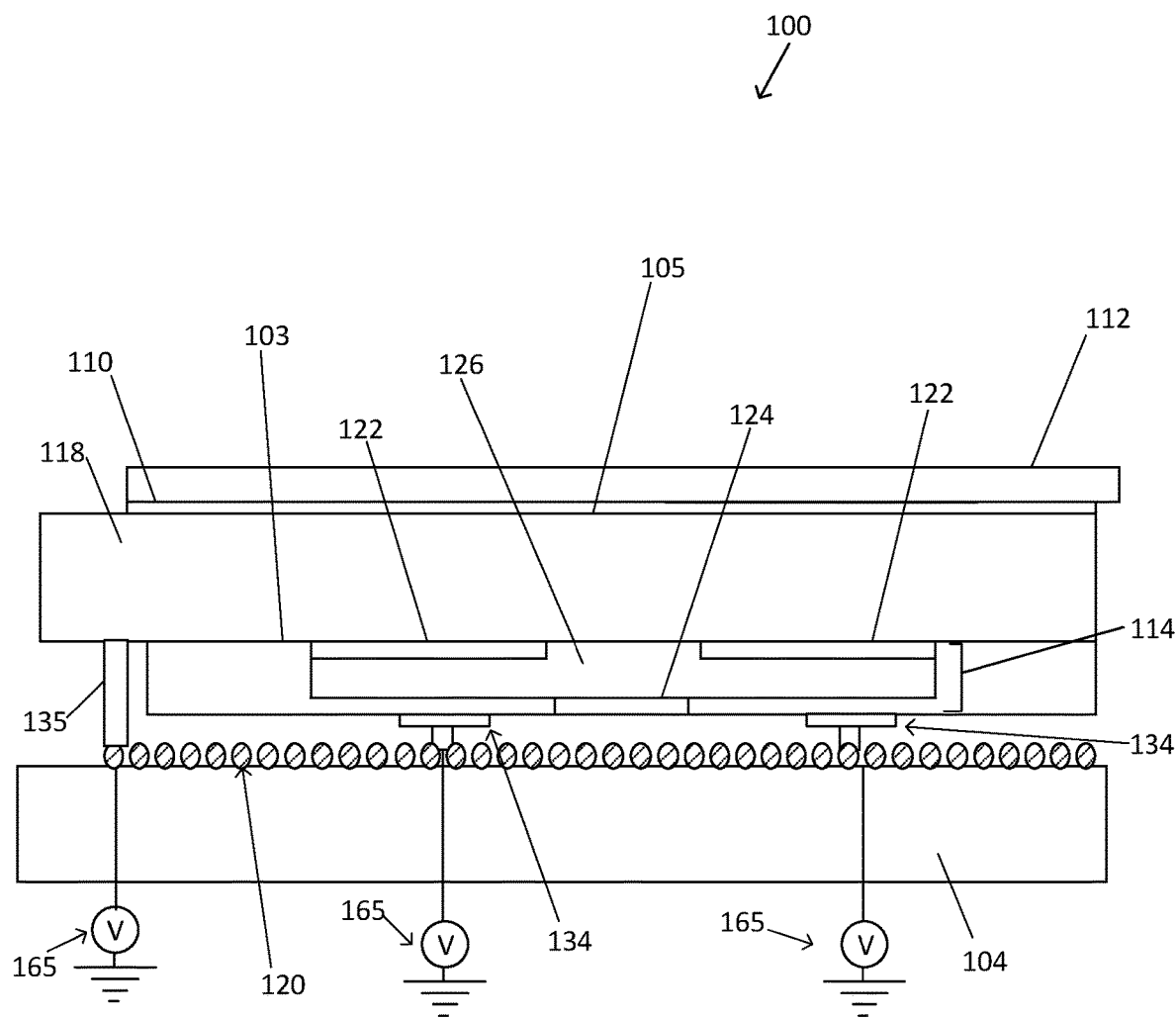

In another embodiment, the TEC 114 may be assembled in a dual gated configuration. For example, FIG. 3G depicts a configuration in which the dummy die 118 may be electrically isolated from the cooling solution 112 by forming a dielectric material, such as an insulating TIM 110 material, between the second side 105 of the dummy die 118, and the cooling solution 112. In another embodiment, a dielectric material may be formed on the the second side 105 of the dummy die 118, such as a silicon dioxide material, or a silicon nitride material, for example. A conductive element 135, such as a conductive copper bump for example, may be formed between the first side 103 of the dummy die 118 and the first die 104. In this configuration, the dummy die 118 may be back gated, wherein the dummy die 118 possesses a back gate voltage 165 as applied through the interconnect structures 120 of the first die 104.

Figure 3H:
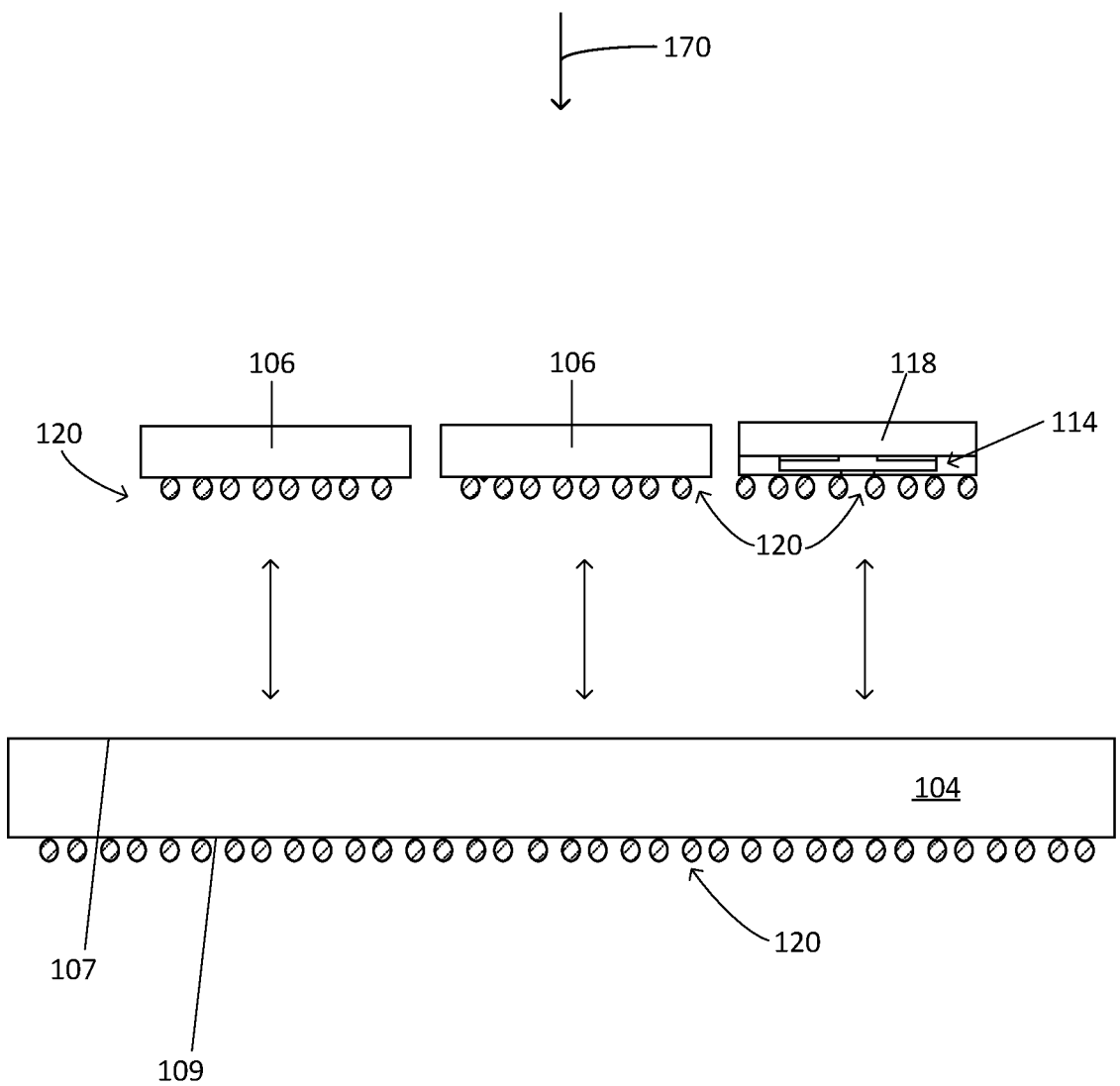

FIG. 3H depicts an attachment process 170, where additional die 106 are attached to the first die 104. In an embodiment, interconnect structures 120 of the additional die 106 are attached to a first side 107 of the first die 104. The interconnect structures 120 of the TEC 114, including the dummy die 118 coupled to the TEC 114, are attached to the first side 107 of the first die 104 adjacent to the additional die 106. Any number of TEC 114 structures, and any number of additional die 106 may be placed on the first side 107 of the first die 104, depending upon the particular application. In an embodiment, the TEC structure 114 may comprise a non-gated TEC structure 114, however in other embodiments, the TEC 114 may comprise a gated TEC 114, such as those depicted in FIGS. 3E-3G, for example. The second side 109 of the first die 104 may comprise interconnect structures 120, such as solder balls, for example.

Figure 3I:
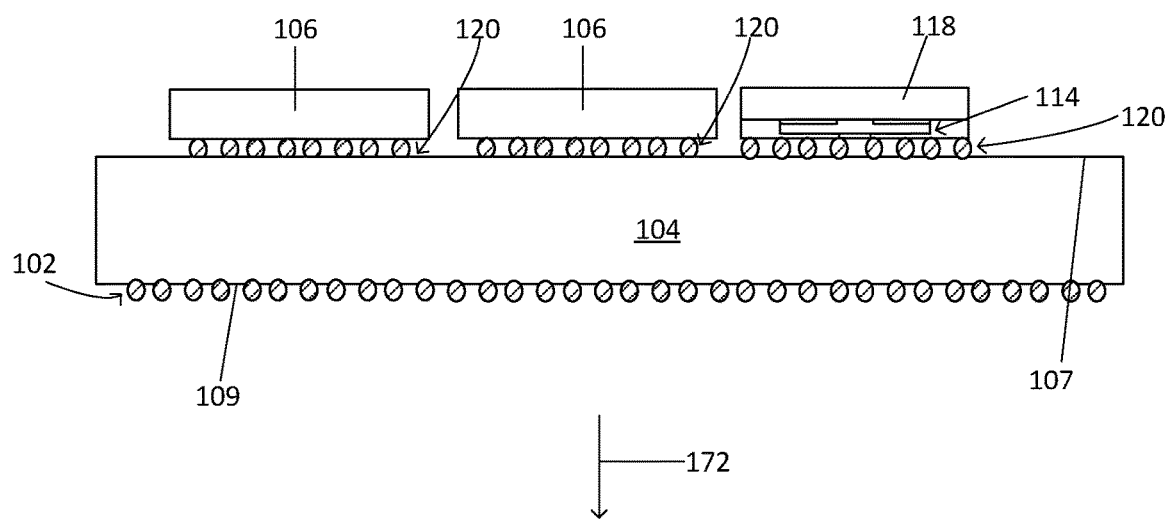
Figure 3I:
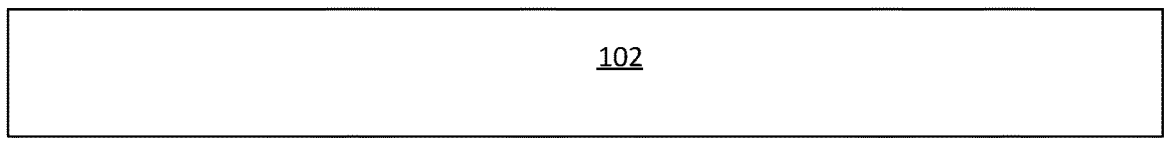

In FIG. 3I, the second side 109 of the first die 104 (with the additional die 106 and the adjacent TEC 114 on the first side 107 of the first die 104) may be attached to a substrate 102, by utilizing any appropriate die attach process 172. The substrate 102 may comprise an interposer, for example, or in other embodiments the substrate 102 may comprise a motherboard. The substrate 102 may comprise various types of materials, such as conductive, dielectric and/or semiconductor materials, and may be physically and electrically coupled with the additional die 106 and the first die 104. The dice 106, 104 may include any number of circuit elements, such as any type of transistor elements and/or passive elements. The dice 104, 106 may comprise N-type and/or P-type transistors, which may include materials such as silicon, germanium, indium, antimonide, lead telluride, indium arsenide, indium phosphide, gallium arsenide, or gallium antimonide, for example. Any of the dice 105, 06 may include such structures as planar transistors and/or nonplanar transistors, FinFET transistors, nanowire transistors and/or nanoribbon transistors.

The die 104 may be attached to the substrate 102 by using any suitable attachment process 172, where the plurality of interconnect features 120 on the second side 109 of the die 104 may be joined to interconnect features/pads (not shown) that are on the surface of the substrate 102. Active surfaces of the die 104 may be attached to the substrate 102, wherein conductive contacts of various integrated circuit devices, such as transistor devices, for example, may be available for connection to the package substrate 102.

The interconnect structures 120 may be formed by using solder materials, such as tin, indium, silver, gold, nickel, for example in an embodiment. Other conductive materials may be used to form the interconnect structures. The interconnect structures 120 may comprise any shape, such as a spherical shape or a rectangular shape, for example. The interconnect structures 120 may be formed using metallization processing such as physical vapor deposition or plating processing. In an embodiment, the substrate 102 may be subsequently attached to a board, such as a motherboard, for example.

Figure 4:
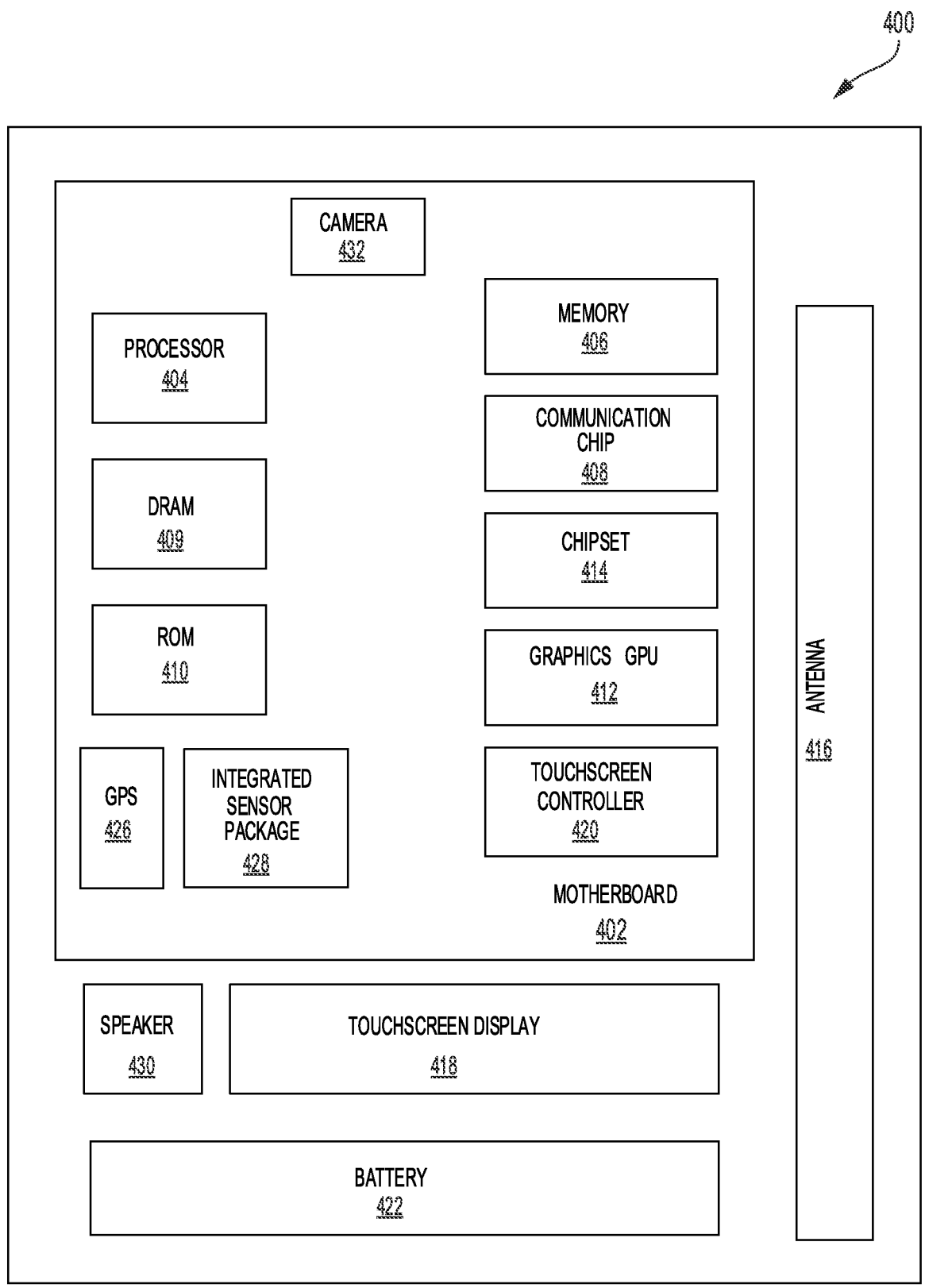
FIG. 4 is a functional block diagram of a computing device employing packaging structures having thermal solution structures, according to embodiments.

FIG. 4 is a schematic of a computing device 400 that may be implemented incorporating the package structures described in any of the embodiments herein comprising TEC structures that provide thermal cooling for a die that may experience local heating from hot spots, such as those depicted in FIG. 1A, for example. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, an integrated sensor 428, a speaker 430, a camera 432, an amplifier (not shown), compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A microelectronic package structure comprising:
    a substrate;
    a first die on the substrate;
    one or more additional dice on the first die;
    a thermoelectric cooler (TEC) on the first die adjacent at least one of the one or more additional dice, wherein the TEC comprises a thermoelectric material, wherein a first side of the thermoelectric material is on the first die and wherein a dummy die is on a second side of the thermoelectric material, wherein the second side is opposite the first side; and
    the dummy die on the TEC, wherein the dummy die is thermally coupled to the first die.

2. The microelectronic device package structure of claim 1, wherein a first portion of a first electrode is on the first side of the thermoelectric material, and a second portion of the first electrode is opposite the first portion of the first electrode on the first side of the thermoelectric material, and wherein a distance is between the first portion and the second portion.

3. The microelectronic device package structure of claim 2, wherein a second electrode is on the second side of the thermoelectric material, wherein the distance between the first portion and the second portion is over a footprint of the second electrode.

4. The microelectronic package structure of claim 3, wherein the first electrode comprises a radius that is greater than about twice a radius of the second electrode.

5. The microelectronic package structure of claim 3 wherein a gating electrode is adjacent the second electrode, wherein the gating electrode is electrically coupled to the TEC, and is capable of applying a gate voltage to the TEC.

6. The microelectronic package structure of claim 1, wherein the dummy die comprises a first side and an opposing second side, and wherein the dummy die comprises a silicon material, and wherein a dielectric layer is on the second side of the dummy die, and wherein the TEC is at least partially embedded within the dielectric layer.

7. The microelectronic package structure of claim 6, wherein a thermal solution is thermally coupled to the first side of the dummy die, and is thermally coupled to the additional dice, and wherein a heat sink is thermally coupled to the thermal solution.

8. The microelectronic package structure of claim 6, wherein a gating electrode is on the second side of the dummy die, wherein the gating electrode is electrically coupled to the TEC, and wherein the gating electrode is capable of applying a gate voltage to the TEC.

9. An assembly comprising:
    a substrate;
    a first die comprising an integrated circuit, wherein the first die is on the substrate;
    a second die and a third die on a first side of the first die;
    a thermoelectric cooler (TEC) on the first side of the first die, adjacent one or more of the second die or the third die, and wherein the TEC is at least partially embedded within a dielectric material;
    a dummy die on the TEC, wherein the dummy die is thermally coupled to the first die, and wherein the dummy die comprises silicon, wherein a thermal interface material is on surfaces of the second die, the third die, and on a surface of the dummy die, wherein the thermal interface material is substantially planar; and
    a thermal solution on the dummy die.

10. The assembly of claim 9, wherein the TEC comprises:
    a thermoelectric material, comprising a first side and a second side opposite the first side;
    a first portion of a first electrode and a second portion of a second electrode, opposite the first portion, on the first side of the thermoelectric material, wherein a distance is between the first portion and the second portion; and a second electrode on the second side of the thermoelectric material, wherein a footprint of the second electrode is within the distance between the first portion and the second portion of the first electrode.

11. The assembly of claim 10, wherein a radius of the first electrode is greater than about twice a radius of the second electrode.

12. The assembly of claim 10, wherein the thermoelectric material comprises alternating segments of P-type and N-type materials.

13. The assembly of claim 10 wherein the thermoelectric material comprises one or more of bismuth, tellurium, antimony, lead, silicon, germanium, chalcogenides, or nanowires.

14. The assembly of claim 10 wherein the thermoelectric material comprises a thickness of between about 10 microns and about 50 microns, and wherein one or more gate electrodes are adjacent the second electrode, wherein the one or more gate electrodes are electrically coupled to the thermoelectric material.

* * * * *